United States Patent
Aikawa

(10) Patent No.: US 10,381,989 B2
(45) Date of Patent: Aug. 13, 2019

(54) HIGH-FREQUENCY CIRCUIT, FRONT END MODULE, AND COMMUNICATION APPARATUS

(71) Applicant: Murata Manufacturing Co., Ltd., Nagaokakyo-shi, Kyoto-fu (JP)

(72) Inventor: Kiyoshi Aikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/142,079

(22) Filed: Sep. 26, 2018

(65) Prior Publication Data

US 2019/0103843 A1 Apr. 4, 2019

(30) Foreign Application Priority Data

Sep. 29, 2017 (JP) ................................ 2017-190582

(51) Int. Cl.
*H04B 1/06* (2006.01)
*H04B 1/10* (2006.01)
(Continued)

(52) U.S. Cl.
CPC ............. *H03F 1/565* (2013.01); *H03F 3/189* (2013.01); *H04B 1/006* (2013.01); *H04B 1/18* (2013.01); *H03F 2200/111* (2013.01); *H03F 2200/165* (2013.01); *H03F 2200/222* (2013.01); *H03F 2200/294* (2013.01); *H03F 2200/387* (2013.01)

(58) Field of Classification Search
CPC ........ H04B 1/005; H04B 1/04; H04B 1/0458; H04B 1/0475; H04B 1/16; H04B 1/40; H03F 3/189; H03F 2200/372; H03F 2200/387; H03F 2200/451; H03F 2203/21139
USPC ......... 455/269, 272, 277.1, 295, 296, 552.1, 455/553.1
See application file for complete search history.

(56) References Cited

U.S. PATENT DOCUMENTS 6,949,979 B2 * 9/2005 Lu ............................. H03F 1/22
330/305
7,440,729 B2 * 10/2008 Solski .................... H03H 7/383
455/552.1
(Continued)

FOREIGN PATENT DOCUMENTS

JP 2015-204628 A 11/2015

*Primary Examiner* — Quochien B Vuong
(74) *Attorney, Agent, or Firm* — Keating & Bennett, LLP

(57) ABSTRACT

A high-frequency circuit includes a first signal path transmitting a high-frequency signal in a first frequency band group, a second signal path transmitting a high-frequency signal in a second frequency band group, a switch including a common terminal and selection terminals, a first low noise amplifier including an input terminal connected to the first signal path and an output terminal connected to a first selection terminal, a second low noise amplifier including an input terminal connected to the second signal path and an output terminal connected to a second selection terminal, and an output-side impedance matching circuit that matches impedance at the output side of the first low noise amplifier or impedance at the output side of the second low noise amplifier with a predetermined impedance with a conductive state between the a third selection terminal and the common terminal.

20 Claims, 6 Drawing Sheets

(51) Int. Cl.
  *H04M 1/00* (2006.01)
  *H03F 1/56* (2006.01)
  *H04B 1/18* (2006.01)
  *H03F 3/189* (2006.01)
  *H04B 1/00* (2006.01)

(56) References Cited

U.S. PATENT DOCUMENTS

| | | | |
|---|---|---|---|
| 9,484,150 B2 * | 11/2016 | Wang | H04B 1/0458 |
| 9,485,001 B2 * | 11/2016 | Wloczysiak | H04B 7/0825 |
| 10,075,160 B2 * | 9/2018 | Oshita | H03K 17/162 |
| 2006/0189286 A1 * | 8/2006 | Kyu | H03F 3/19 |
| | | | 455/144 |
| 2010/0216419 A1 * | 8/2010 | Kanasaki | H01Q 1/243 |
| | | | 455/269 |
| 2015/0296515 A1 | 10/2015 | Pehlivanoglu | |

\* cited by examiner

FIG. 2
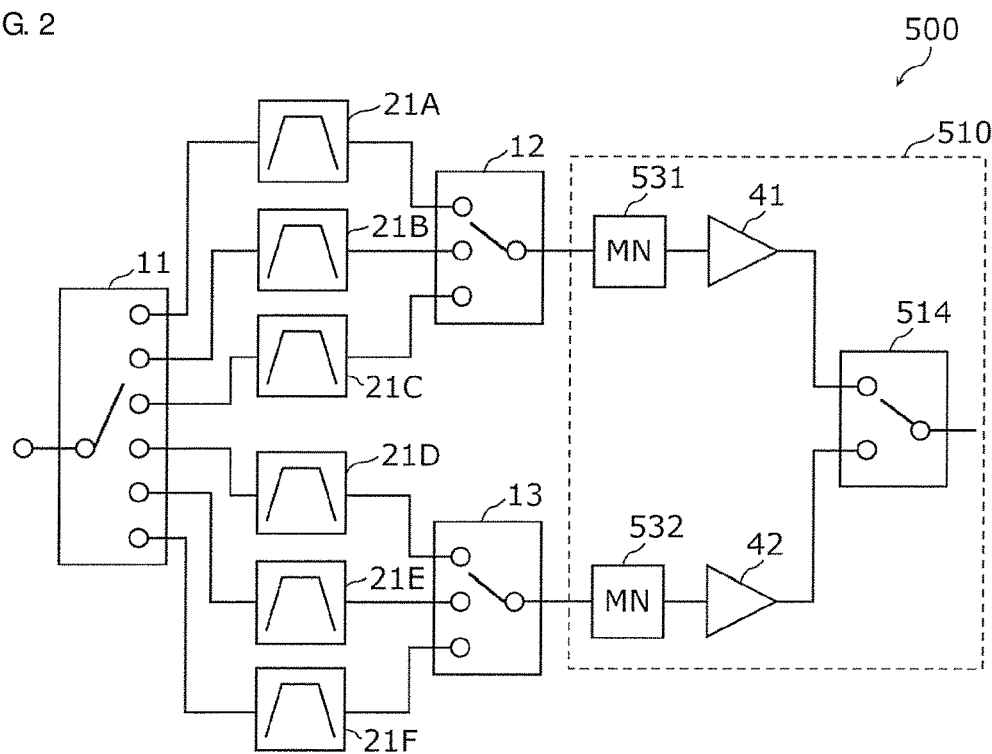
FIG. 3     Smith CHART
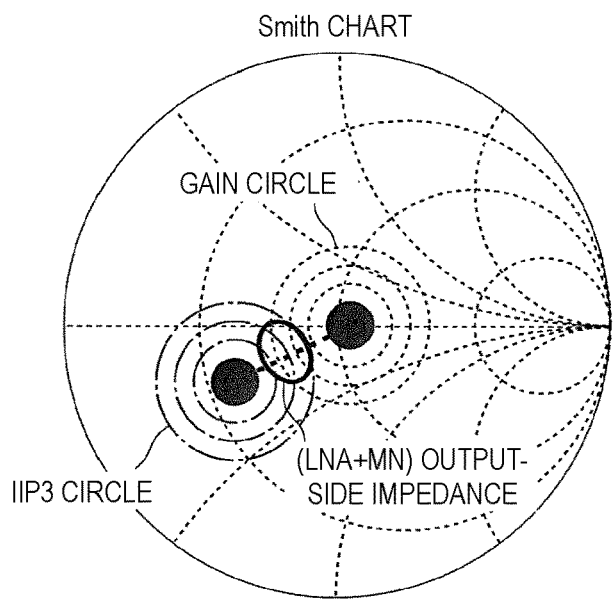
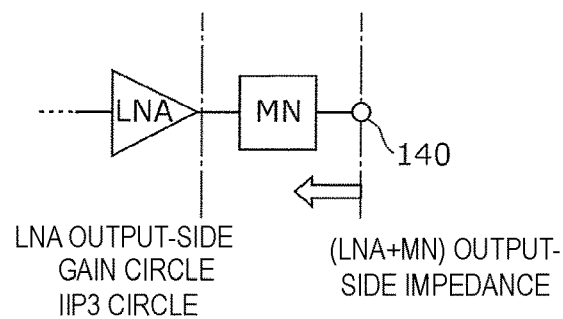

HIGH-FREQUENCY CIRCUIT, FRONT END MODULE, AND COMMUNICATION APPARATUS

CROSS REFERENCE TO RELATED APPLICATIONS

This application claims the benefit of priority to Japanese Patent Application No. 2017-190582 filed on Sep. 29, 2017. The entire contents of this application are hereby incorporated herein by reference.

BACKGROUND OF THE INVENTION

1. Field of the Invention

The present invention relates to a high-frequency circuit, a front end module, and a communication apparatus.

2. Description of the Related Art

Multiband mobile communication terminals that support multiple frequency bands using one terminal are required in recent years. In accordance with this requirement, for example, multiband front end reception circuits including low noise amplifiers are also required.

Japanese Unexamined Patent Application Publication No. 2015-204628 discloses a multiband reception circuit configured to operate in three frequency bands using a common antenna and three low noise amplifiers. A switch for selecting one signal path, among three signal paths used to transmit the three respective frequency bands, is provided downstream of the three low noise amplifiers.

In the multiband reception circuit disclosed in Japanese Unexamined Patent Application Publication No. 2015-204628, it is necessary to match the impedance at the output side of the amplifiers with the impedance at the switch side thereof in all of the multiple frequency bands. In order to achieve this, for example, a configuration may be adopted in which an impedance matching circuit is provided at the output side of the amplifier on each signal path on which the amplifier is provided.

However, with the development of the multiband, multiple different frequency bands are transmitted on one signal path. In this case, it is difficult to achieve the impedance matching at the output side of the amplifiers over a wide band including the multiple different frequency bands with the impedance matching circuit provided at the output side of the amplifier on each signal path. In addition, the impedance matching circuit is increased in size with the increasing number of bands.

SUMMARY OF THE INVENTION

Preferred embodiments of the present invention provide high-frequency circuits, front end modules, and communication apparatuses, each of which is compact and capable of improving or optimizing the output impedance matching of amplifiers over a wide frequency range including multiple frequency bands.

According to a preferred embodiment of the present invention, a high-frequency circuit includes a first signal path on which a high-frequency signal in a first frequency band group is transmitted; a second signal path on which a high-frequency signal in a second frequency band group is transmitted; a first switch that includes a common terminal and a plurality of selection terminals; a first amplifier which includes a first input terminal and a first output terminal, the first input terminal is connected to the first signal path, and the first output terminal is connected to a first selection terminal, among the plurality of selection terminals; a second amplifier which includes a second input terminal and a second output terminal, the second input terminal is connected to the second signal path, and the second output terminal is connected to a second selection terminal, among the plurality of selection terminals; and an output-side impedance matching circuit that is connected to at least one selection terminal, which is different from the first selection terminal and the second selection terminal, among the plurality of selection terminals, and that matches impedance of the first amplifier at the first output terminal side or impedance of the second amplifier at the second output terminal side with predetermined impedance with a conductive state between the at least one selection terminal and the common terminal. A conductive state between the first selection terminal and the common terminal and a conductive state between the second selection terminal and the common terminal are exclusively switched with the first switch.

Since the first amplifier and the second amplifier connected to the common terminal, which is an output terminal of the high-frequency circuit, have frequency characteristics corresponding to the respective frequency bands, the first amplifier and the second amplifier are selectively used depending on the frequency band group that is used. Accordingly, the output impedance of the amplifier is varied depending on which amplifier, among the first amplifier and the second amplifier, is connected.

With the above-described configuration, the impedance matching circuit is capable of being selectively added to the path that is connected without adding an impedance matching circuit for each amplifier depending on whether the high-frequency circuit is in a state in which the first amplifier is connected to the common terminal or a state in which the second amplifier is connected to the common terminal. Accordingly, the output impedance of the amplifier is capable of being matched with the impedance (predetermined impedance) at the output side of the common terminal regardless of which amplifier, among the first amplifier and the second amplifier, is connected to the common terminal. Consequently, since the impedance matching is capable of being achieved at the output side of the first amplifier and the second amplifier over a wide band including the first frequency band group and the second frequency band group using the compact impedance matching circuit, it is possible to improve the output impedance matching.

On a Smith chart, impedance in the first frequency band group, viewed from the common terminal to the first amplifier side, may intersect with a line connecting a center of a gain circle, which indicates the impedance at which gain in the first amplifier is maximized in the first frequency band group, to a point at which a third order input intercept point of the first amplifier is maximized in the first frequency band group.

With the above-described configuration, the output impedance matching is capable of being improved or optimized at the output side of the first amplifier in consideration of both the gain and intermodulation distortion in the first amplifier.

On a Smith chart, impedance in the second frequency band group, viewed from the common terminal to the second amplifier side, may intersect with a line connecting a center of a gain circle, which indicates the impedance at which gain in the second amplifier is maximized in the second frequency band group, to a point at which a third order input intercept point of the second amplifier is maximized in the second frequency band group.

With the above-described configuration, the output impedance matching is capable of being improved or optimized at the output side of the second amplifier in consideration of both the gain and the intermodulation distortion in the second amplifier.

The output-side impedance matching circuit may include a first parallel matching circuit connected between a third selection terminal, among the plurality of selection terminals, and ground. A conductive state between the first selection terminal and the common terminal and a conductive state between the second selection terminal and the common terminal may be exclusively switched, and a conductive state and a non-conductive state between the third selection terminal and the common terminal may be switched with the first switch.

With the above-described configuration, the first parallel matching circuit is capable of being shunt-connected to the path connecting the first amplifier or the second amplifier to the common terminal. Accordingly, it is possible to achieve the impedance matching at the output side of the first amplifier and the second amplifier over a wide band.

The output-side impedance matching circuit may further include a second parallel matching circuit connected between a fourth selection terminal, among the plurality of selection terminals, and the ground. The conductive state between the first selection terminal and the common terminal and the conductive state between the second selection terminal and the common terminal may be exclusively switched, the conductive state and the non-conductive state between the third selection terminal and the common terminal may be switched, and a conductive state and a non-conductive state between the fourth selection terminal and the common terminal may be switched with the first switch.

With the above-described configuration, the first parallel matching circuit and/or the second parallel matching circuit is capable of being shunt-connected to the path connecting the first amplifier or the second amplifier to the common terminal. Accordingly, it is possible to achieve the impedance matching at the output side of the first amplifier and the second amplifier over a wide band with higher accuracy.

The output-side impedance matching circuit may include a first serial matching circuit connected between a fifth selection terminal and a sixth selection terminal, among the plurality of selection terminals. The fifth selection terminal may be connected to the common terminal. Either of a connection between the first selection terminal and the common terminal and a conductive state between the first selection terminal and the common terminal via the sixth selection terminal, the first serial matching circuit, and the fifth selection terminal, and either of a connection between the second selection terminal and the common terminal and a conductive state between the second selection terminal and the common terminal via the sixth selection terminal, the first serial matching circuit, and the fifth selection terminal may be exclusively switched with the first switch.

With the above-described configuration, the first serial matching circuit is capable of being provided in series on the path connecting the first amplifier or the second amplifier to the common terminal. Accordingly, it is possible to achieve the impedance matching at the output side of the first amplifier and the second amplifier over a wide band.

The output-side impedance matching circuit may further include a second serial matching circuit connected between a seventh selection terminal and an eighth selection terminal, among the plurality of selection terminals. The sixth selection terminal may be connected to the seventh selection terminal. One of the connection between the first selection terminal and the common terminal, the conductive state between the first selection terminal and the common terminal via the sixth selection terminal, the first serial matching circuit, and the fifth selection terminal, and a conductive state between the first selection terminal and the common terminal via the eighth selection terminal, the second serial matching circuit, and the seventh selection terminal, and one of the connection between the second selection terminal and the common terminal, the conductive state between the second selection terminal and the common terminal via the sixth selection terminal, the first serial matching circuit, and the fifth selection terminal, and a conductive state between the second selection terminal and the common terminal via the eighth selection terminal, the second serial matching circuit, and the seventh selection terminal may be exclusively switched with the first switch.

With the above-described configuration, the first serial matching circuit and/or the second serial matching circuit is capable of being provided in series on the path connecting the first amplifier or the second amplifier to the common terminal. Accordingly, it is possible to achieve the impedance matching at the output side of the first amplifier and the second amplifier over a wide band with higher accuracy.

The high-frequency circuit may further include an input-side impedance matching circuit connected to the first input terminal or the second input terminal and a substrate on which the first switch, the first amplifier, the second amplifier, the input-side impedance matching circuit, and the output-side impedance matching circuit are mounted. The input-side impedance matching circuit may include a first inductor mounted on the substrate. The output-side impedance matching circuit may include a second inductor mounted on the substrate. A winding axis of a coil defining the first inductor may be perpendicular or substantially perpendicular to a longitudinal direction of the first inductor. A winding axis of a coil defining the second inductor may be perpendicular or substantially perpendicular to a longitudinal direction of the second inductor. In a planar view of the substrate, the longitudinal direction of the first inductor may coincide or substantially coincide to the longitudinal direction of the second inductor, and the first inductor and the second inductor may be disposed on the same straight line.

With the above-described configuration, since the distance between magnetic fluxes occurring around the first inductor and the second inductor is ensured, the interaction of the magnetic fields is reduced or prevented. Accordingly, the isolation between the input-side impedance matching circuit and the output-side impedance matching circuit is improved.

The high-frequency circuit may further include an input-side impedance matching circuit connected to the first input terminal or the second input terminal and a substrate on which the first switch, the first amplifier, the second amplifier, the input-side impedance matching circuit, and the output-side impedance matching circuit are mounted. The input-side impedance matching circuit may include a first inductor mounted on the substrate. The output-side impedance matching circuit may include a second inductor mounted on the substrate. A winding axis of a coil defining the first inductor may be perpendicular or substantially perpendicular to a longitudinal direction of the first inductor. A winding axis of a coil defining the second inductor may be perpendicular or substantially perpendicular to a longitudinal direction of the second inductor. In a planar view of the substrate, the longitudinal direction of the first inductor may be orthogonal or substantially orthogonal to the longitudinal direction of the second inductor, and the first inductor and the second inductor may be disposed so that a straight line that passes through a center of one of the first inductor and the second inductor and that is parallel or substantially parallel to the longitudinal direction of the one of the first inductor and the second inductor passes through a center of the other of the first inductor and the second inductor.

With the above-described configuration, since the magnetic fluxes occurring around the first inductor and the second inductor are orthogonal or substantially orthogonal to each other, the interaction of the magnetic fields is reduced or prevented. Accordingly, the isolation between the input-side impedance matching circuit and the output-side impedance matching circuit is improved.

The high-frequency circuit may further include an input-side impedance matching circuit connected to the first input terminal or the second input terminal and a substrate on which the first switch, the first amplifier, the second amplifier, the input-side impedance matching circuit, and the output-side impedance matching circuit are mounted. The input-side impedance matching circuit may include a first inductor mounted on the substrate. The output-side impedance matching circuit may include a second inductor mounted on the substrate. A winding axis of a coil defining the first inductor may be perpendicular or substantially perpendicular to a longitudinal direction of the first inductor. A winding axis of a coil defining the second inductor may be perpendicular or substantially perpendicular to a longitudinal direction of the second inductor. A winding axis of a coil of one of the first inductor and the second inductor may be parallel or substantially parallel to a main surface of the substrate. A winding axis of a coil of the other of the first inductor and the second inductor may be perpendicular or substantially perpendicular to the main surface of the substrate. In a planar view of the substrate, the first inductor and the second inductor may be parallel or substantially parallel to each other so that the longitudinal direction of the first inductor coincides or substantially coincides with the longitudinal direction of the second inductor.

With the above-described configuration, since the magnetic fluxes occurring around the first inductor and the second inductor are orthogonal or substantially orthogonal to each other, the interaction of the magnetic fields is reduced or prevented. Accordingly, the isolation between the input-side impedance matching circuit and the output-side impedance matching circuit is improved.

According to another preferred embodiment of the present invention, a front end module includes any of the high-frequency circuits described above; a second switch including an antenna common terminal and a plurality of selection terminals; a first filter which is disposed at an input side of the first amplifier, which is connected between the first signal path and the second switch, and a pass band of which is a first frequency band included in the first frequency band group; and a second filter which is disposed at an input side of the second amplifier, which is connected between the second signal path and the second switch, and a pass band of which is a second frequency band included in the second frequency band group. Connection and non-connection between the antenna common terminal and the first filter is switched, and connection and non-connection between the antenna common terminal and the second filter is switched with the second switch.

With the above-described configuration, it is possible to provide the compact front end module that achieves the improved output impedance matching over a wide band.

According to another preferred embodiment of the present invention, a communication apparatus includes a radio-frequency signal processing circuit that processes a high-frequency signal received with an antenna element and a front end module according to a preferred embodiment of the present invention, which transmits the high-frequency signal between the antenna element and the radio-frequency signal processing circuit.

With the above-described configuration, it is possible to provide the compact communication apparatus having the improved output impedance matching over a wide band.

According to preferred embodiments of the present invention, high-frequency circuits, front end modules, and communication apparatuses are provided, which are compact and which are capable of improving or optimizing the output impedance matching of amplifiers over a wide frequency range including multiple frequency bands.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a diagram illustrating an exemplary circuit configuration of a front end module according to a comparative example.

FIG. 3 is a Smith chart representing the relationship between impedance at the output side of a low noise amplifier, a gain circle, and an IIP3 circle in a preferred embodiment of the present invention.

DETAILED DESCRIPTION OF THE PREFERRED EMBODIMENTS

Preferred embodiments of the present invention will herein be described in detail with reference to the drawings.

The preferred embodiments described below indicate comprehensive or specific examples. Numerical values, shapes, materials, components, the arrangement of the components, the connection modes of the components, and other features and elements, which are indicated in the preferred embodiments described below, are only examples and are not intended to limit the present invention.

Figure 1:
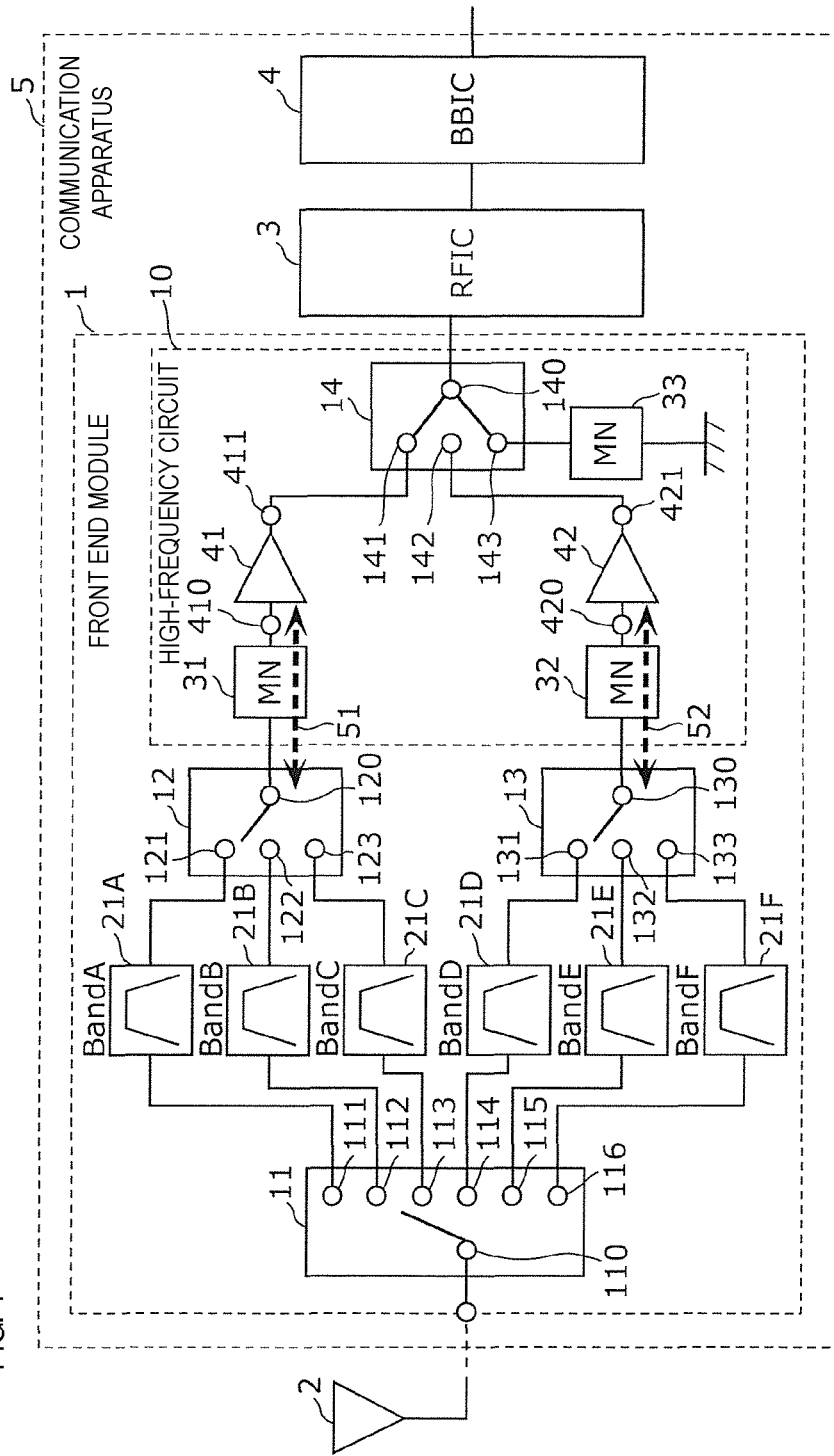
FIG. 1 is a diagram illustrating an exemplary circuit configuration of a communication apparatus according to a preferred embodiment of the present invention and an antenna element.

FIG. 1 is a diagram illustrating an exemplary circuit configuration of a communication apparatus 5 according to a preferred embodiment of the present invention and an antenna element 2. Referring to FIG. 1, the communication apparatus 5 includes a front end module 1, a radio-frequency signal processing circuit (radio-frequency integrated circuit (RFIC)) 3, and a baseband signal processing circuit (baseband integrated circuit (BBIC)) 4.

The RFIC 3 is an RF signal processing circuit that processes a high-frequency signal transmitted or received with the antenna element 2. Specifically, the RFIC 3 performs signal processing, such as down-conversion, for example, to a high-frequency signal (a high-frequency reception signal here) input into the RFIC 3 from the antenna element 2 via the front end module 1 and supplies a reception signal generated through the signal processing to the BBIC 4.

In the present preferred embodiment, the RFIC 3 also defines and functions as a controller that controls connection of switches 11, 12, 13, and 14 (described below) in the front end module 1 based on a frequency band that is used. Specifically, the RFIC 3 switches a selection terminal to be connected to a common terminal in each of the switches 11, 12, 13, and 14 in response to a control signal (not illustrated). The controller may be provided outside the RFIC 3 and, for example, may be provided in the front end module 1 or the BBIC 4.

A detailed configuration of the front end module 1 will now be described.

Referring to FIG. 1, the front end module 1 is a reception front end circuit and includes a high-frequency circuit 10, the switches 11, 12, and 13, and filters 21A, 21B, 21C, 21D, 21E, and 21F.

The high-frequency circuit 10 includes low noise amplifiers 41 and 42, the switch 14, input-side impedance matching circuits 31 and 32, an output-side impedance matching circuit 33, and signal paths 51 and 52.

The signal path 51 is a first signal path on which a high-frequency signal in a first frequency band group is transmitted. The first frequency band group is applied to, for example, a low band group.

The signal path 52 is a second signal path on which a high-frequency signal in a second frequency band group is transmitted. The second frequency band group is applied to, for example, a high band group allocated to frequency bands higher than the low band group.

The switch 14 is a first switch that is disposed at the output side of the low noise amplifiers 41 and 42 and that includes a common terminal 140, a selection terminal 141 (a first selection terminal), a selection terminal 142 (a second selection terminal), and a selection terminal 143 (a third selection terminal). The switch 14 exclusively switches between a conductive state between the selection terminal 141 and the common terminal 140 and the conductive state between the selection terminal 142 and the common terminal 140. In addition, the switch 14 switches between the conductive state and a non-conductive state between the common terminal 140 and the selection terminal 143. More specifically, the switch 14 is preferably a multi-port switch capable of simultaneously performing the connection between the common terminal 140 and the selection terminal 141 and the connection between the common terminal 140 and the selection terminal 143 or simultaneously performing the connection between the common terminal 140 and the selection terminal 142 and the connection between the common terminal 140 and the selection terminal 143.

The low noise amplifier 41 includes an input terminal 410 (a first input terminal) and an output terminal 411 (a first output terminal). The low noise amplifier 41 is a first amplifier the input terminal 410 of which is connected to one end of the signal path 51 and the output terminal 411 of which is connected to the selection terminal 141.

The low noise amplifier 42 includes an input terminal 420 (a second input terminal) and an output terminal 421 (a second output terminal). The low noise amplifier 42 is a second amplifier the input terminal 420 of which is connected to one end of the signal path 52 and the output terminal 421 of which is connected to the selection terminal 142.

The low noise amplifier 41 is a low noise amplifier circuit that amplifies a high-frequency signal supplied from any of the filters 21A to 21C via the switch 12 and is preferably defined by a transistor and other suitable components, for example. The low noise amplifier 42 is a low noise amplifier circuit that amplifies a high-frequency signal supplied from any of the filters 21D to 21F via the switch 13 and is preferably defined by a transistor and other suitable components, for example.

The output-side impedance matching circuit 33 is connected to the selection terminal 143, which is different from the selection terminals 141 and 142, among the plurality of selection terminals. The output-side impedance matching circuit 33 is capable of matching the impedance at the output terminal 411 side of the low noise amplifier 41 or the impedance at the output terminal 421 side of the low noise amplifier 42 with predetermined impedance with the conductive state between the selection terminal 143 and the common terminal 140. In other words, in the high-frequency circuit 10, the selection terminal 143 is added to the switch 14 disposed at the output side of the low noise amplifiers to provide the output-side impedance matching circuit 33. In the present preferred embodiment, although the output-side impedance matching circuit 33 is preferably, for example, a first parallel matching circuit connected between the selection terminal 143 and ground and is shunt-connected to the switch 14, it is sufficient for the output-side impedance matching circuit 33 to be connected to the selection terminal 143 at one end and the other end of the output-side impedance matching circuit 33 may not be grounded.

The output-side impedance matching circuit 33 has a circuit configuration in which circuit elements, such as an inductor and a capacitor, are connected in series or in parallel to each other.

The input-side impedance matching circuit 31 is provided on the signal path 51 and is connected to the input terminal 410 of the low noise amplifier 41. The input-side impedance matching circuit 32 is provided on the signal path 52 and is connected to the input terminal 420 of the low noise amplifier 42. Each of the input-side impedance matching circuits 31 and 32 has a circuit configuration in which circuit elements, such as an inductor and a capacitor, are connected in series or in parallel to each other.

The switch 11 is a second switch including an antenna common terminal 110 and selection terminals 111, 112, 113, 114, 115, and 116. The antenna common terminal 110 is connected to, for example, the antenna element 2. The switch 11 is preferably a single-pole six-throw (SP6T)

switch circuit, for example, in which the antenna common terminal 110 is capable of being connected to one or more selection terminals, among the selection terminals 111 to 116.

The switch 12 is disposed at the input side of the low noise amplifier 41 and includes a common terminal 120 and selection terminals 121, 122, and 123. The switch 12 is preferably a single-pole three-throw (SP3T) switch circuit, for example, connecting the common terminal 120 to one of the selection terminals 121, 122, and 123. The common terminal 120 is connected to the other end of the signal path 51.

The switch 13 is disposed at the input side of the low noise amplifier 42 and includes a common terminal 130 and selection terminals 131, 132, and 133. The switch 13 is preferably an SP3T switch circuit, for example, connecting the common terminal 130 to one of the selection terminals 131, 132, and 133. The common terminal 130 is connected to the other end of the signal path 52.

The filter 21A is a first filter that is disposed at the input side of the low noise amplifier 41 and connected between the selection terminal 111 and the selection terminal 121. The pass band of the filter 21A is a band A (a first frequency band) included in the first frequency band group.

The filter 21B is disposed at the input side of the low noise amplifier 41 and is connected between the selection terminal 112 and the selection terminal 122. The pass band of the filter 21B is a band B included in the first frequency band group.

The filter 21C is disposed at the input side of the low noise amplifier 41 and is connected between the selection terminal 113 and the selection terminal 123. The pass band of the filter 21C is a band C included in the first frequency band group.

The filter 21D is a second filter that is disposed at the input side of the low noise amplifier 42 and that is connected between the selection terminal 114 and the selection terminal 131. The pass band of the filter 21D is a band D (a second frequency band) included in the second frequency band group.

The filter 21E is disposed at the input side of the low noise amplifier 42 and is connected between the selection terminal 115 and the selection terminal 132. The pass band of the filter 21E is a band E included in the second frequency band group.

The filter 21F is disposed at the input side of the low noise amplifier 42 and is connected between the selection terminal 116 and the selection terminal 133. The pass band of the filter 21F is a band F included in the second frequency band group.

Connection between the antenna common terminal 110 and at least one of the filters 21A to 21F is selected with the switch 11.

Connection between one of the filters 21A to 21C and the signal path 51 is selected with the switch 12. Connection between one of the filters 21D to 21F and the signal path 52 is selected with the switch 13.

In the above-described configuration, the front end module 1 is in a state in which one of the filters 21A to 21C is connected to the antenna element 2 and the signal path 51 and a state in which the low noise amplifier 41 is connected to the RFIC 3, or in a state in which one of the filters 21D to 21F is connected to the antenna element 2 and the signal path 52 and a state in which the low noise amplifier 42 is connected to the RFIC 3, through the switching with the switches 11 to 14.

Either of the low noise amplifiers 41 and 42 is selected depending on the frequency band group that is used with the switches 11 to 14. The impedance at the output side of the low noise amplifiers 41 and 42 is varied depending on the frequency band group that is used and the band that is used.

In contrast, since the output-side impedance matching circuit 33 is connected to the selection terminal 143 of the switch 14 in the above-described configuration, the output-side impedance matching circuit 33 is capable of being selectively added to the path that is connected without adding an impedance matching circuit for each amplifier depending on whether the high-frequency circuit 10 is in a state in which the low noise amplifier 41 is connected to the common terminal 140 or a state in which the low noise amplifier 42 is connected to the common terminal 140.

For example, the common terminal 140 is connected to the output-side impedance matching circuit 33 (the common terminal 140 is connected to the selection terminal 143) in the state in which the low noise amplifier 41 is connected to the common terminal 140 (a state in which the selection terminal 141 is connected to the common terminal 140). In contrast, the common terminal 140 is not connected to the output-side impedance matching circuit 33 (the common terminal 140 is not connected to the selection terminal 143) in the state in which the low noise amplifier 42 is connected to the common terminal 140 (a state in which the selection terminal 142 is connected to the common terminal 140).

Alternatively, the common terminal 140 is connected to the output-side impedance matching circuit 33 in a state in which the filter 21A is connected to the signal path 51 and the common terminal 140 is not connected to the output-side impedance matching circuit 33 in a state in which the filter 21B or 21C is connected to the signal path 51 even in the state in which the low noise amplifier 41 is connected to the common terminal 140. The common terminal 140 is connected to the output-side impedance matching circuit 33 in a state in which the filter 21D is connected to the signal path 52 and the common terminal 140 is not connected to the output-side impedance matching circuit 33 in a state in which the filter 21E or 21F is connected to the signal path 52 even in the state in which the low noise amplifier 42 is connected to the common terminal 140. In other words, not only the connection and the non-connection between the common terminal 140 and the output-side impedance matching circuit 33 are capable of being switched in accordance with the frequency band group that is used but also the connection and the non-connection between the common terminal 140 and the output-side impedance matching circuit 33 are capable of being switched in accordance with the band that is used.

Accordingly, the output impedance viewed from the common terminal 140 to the amplifier side is capable of being matched with predetermined impedance regardless of which low noise amplifier, among the low noise amplifiers 41 and 42, is connected to the common terminal 140 (which frequency band group is used) and regardless of which band is used. The impedance at the output side of the low noise amplifiers 41 and 42 is varied depending on the frequency band group or the band that is used. Consequently, it is possible to achieve the impedance matching at the output side of the low noise amplifiers 41 and 42 over a wide band including the first frequency band group and the second frequency band group using the compact output-side impedance matching circuit 33.

Although the high-frequency circuit 10 according to the above-described preferred embodiment preferably includes the two signal paths: the signal path 51 on which a signal in the first frequency band group is transmitted and the signal path 52 on which a signal in the second frequency band group is transmitted, for example the number of signal paths may be three or more.

In addition, although the front end module 1 according to the above-described preferred embodiment preferably includes the six filters 21A to 21F corresponding to the six bands, for example, the number of filters having the pass bands belonging to the first frequency band group may not be three and at least one filter may have the pass band belonging to the first frequency band group. When one filter has the pass band belonging the first frequency band group, it is not necessary to provide the switch 12. Similarly, the number of filters having the pass bands belonging to the second frequency band group may not be three and at least one filter may have the pass band belonging to the second frequency band group. When one filter has the pass band belonging the second frequency band group, it is not necessary to provide the switch 13.

FIG. 2 is a diagram illustrating an exemplary circuit configuration of a front end module 500 according to a comparative example. Referring to FIG. 2, the front end module 500 includes a high-frequency circuit 510, the switches 11 to 13, and the filters 21A to 21F. The front end module 500 according to the comparative example differs from the front end module 1 according to the present preferred embodiment only in the configuration of the high-frequency circuit 510. The high-frequency circuit 510 includes the low noise amplifiers 41 and 42, a switch 514, and input-side impedance matching circuits 531 and 532.

In the above-described configuration of the comparative example, the output impedance viewed from the common terminal to the amplifier side is not capable of being varied from the output impedance of the amplifier depending on a case in which the low noise amplifier 41 is connected to the common terminal of the switch 514 or a case in which the low noise amplifier 42 is connected to the common terminal of the switch 514. This is because no impedance matching circuit is provided at the output side of the low noise amplifiers 41 and 42. Accordingly, for example, when the output impedance of the low noise amplifier 41 is different from the output impedance of the low noise amplifier 42, the impedance viewed from the common terminal of the switch 514 to the amplifier side is not capable being matched with predetermined impedance.

In addition, when the operating frequency of the low noise amplifier 41 is varied depending on the band (filter) that is selected, the output impedance of the low noise amplifier 41 is varied. In the front end module 500 according to the comparative example, the impedance viewed from the common terminal of the switch 514 to the low noise amplifier 41 side is not capable of being varied depending on the operating frequency. Similarly, when the operating frequency of the low noise amplifier 42 is varied depending on the band (filter) that is selected, the output impedance of the low noise amplifier 42 is varied. In the front end module 500 according to the comparative example, the impedance viewed from the common terminal of the switch 514 to the low noise amplifier 42 side is not capable of being varied depending on the operating frequency. In other words, in the front end module 500 according to the comparative example, it is difficult to achieve the impedance matching at the output side of the amplifiers over a wide frequency range including the multiple bands.

In contrast, with the front end module 1 according to the present preferred embodiment, the output impedance viewed from the common terminal 140 to the amplifier side is capable of being varied from the output impedance of the amplifier itself depending on the case in which the low noise amplifier 41 is connected to the common terminal 140 of the switch 14 or the case in which the low noise amplifier 42 is connected to the common terminal 140 of the switch 14. This is because the output-side impedance matching circuit 33 is connected to the selection terminal 143 of the switch 14. Accordingly, for example, when the output impedance of the low noise amplifier 41 is different from the output impedance of the low noise amplifier 42, the impedance viewed from the common terminal 140 to the amplifier side is capable being matched with predetermined impedance.

In addition, when the operating frequency of the low noise amplifier 41 is varied depending on the band (filter) that is selected, the output impedance of the low noise amplifier 41 is varied. In the front end module 1 according to the present preferred embodiment, switching between the conductive state and the non-conductive state between the selection terminal 143 and the common terminal 140 in accordance with the operating frequency enables the impedance viewed from the common terminal 140 to the low noise amplifier 41 side to be varied. Similarly, when the operating frequency of the low noise amplifier 42 is varied depending on the band (filter) that is selected, the output impedance of the low noise amplifier 42 is varied. In the front end module 1 according to the present preferred embodiment, switching between the conductive state and the non-conductive state between the selection terminal 143 and the common terminal 140 in accordance with the operating frequency enables the impedance viewed from the common terminal 140 to the low noise amplifier 42 side to be varied.

In general, signal transmission loss may occur or the linearity between input and output signals may be reduced in accordance with the impedance relationship between circuits (for example, filters or low noise amplifiers) that are connected in a high-frequency circuit (distributed constant circuit). The signal transmission loss and the reduction in the linearity may cause degradation of the characteristics of the entire high-frequency circuit. Accordingly, it is necessary to perform impedance matching in order to adjust the impedance relationship between the circuits that are connected in design of the high-frequency circuit.

However, in the low noise amplifier, such as the low noise amplifier 41 or 42, gain matching impedance, which is the impedance to perform the impedance matching (gain matching) so as to maximize the gain in the low noise amplifier, is different from third order input intercept point (IIP3) matching impedance, which is the impedance to perform the impedance matching (IIP3 impedance matching) so as to maximize the IIP3 indicating the linearity of the low noise amplifier.

FIG. 3 is a Smith chart representing the relationship between the impedance at the output side of the low noise amplifier, a gain circle, and an IIP3 circle in the present preferred embodiment. As illustrated in FIG. 3, the center of the gain circle representing the impedance at which the gain at the output side of the low noise amplifier is maximized does not coincide with a point at which the 3rd order input intercept point at the output side of the low noise amplifier is maximized.

Accordingly, for example, when the gain matching is performed in order to improve the gain in the low noise amplifier, the linearity of the low noise amplifier is reduced due to degradation of the IIP3 impedance matching. In contrast, when the IIP3 impedance matching is performed in the low noise amplifier in order to improve the linearity of the low noise amplifier, the gain in the low noise amplifier is reduced due to degradation of the gain matching.

Consequently, in order to increase the gain while reducing or preventing the reduction in the linearity of the entire high-frequency circuit 10, it is necessary to position the impedance viewed from the common terminal 140 to the low noise amplifier side (including the output-side impedance matching circuit 33) between the center of the gain circle at which the gain in the low noise amplifier is maximized and the point at which the IIP3 is maximized.

More specifically, in the conductive state between the common terminal 140 and the selection terminal 141, the impedance in the first frequency band group, viewed from the common terminal 140 to the low noise amplifier 41 side, preferably intersects with a line connecting the center of the gain circle, which indicates the impedance at which the gain in the low noise amplifier 41 is maximized in the first frequency band group, to the point at which the IIP3 of the low noise amplifier 41 is maximized in the first frequency band group on the Smith chart.

Accordingly, the output impedance matching is capable of being improved or optimized at the output side of the low noise amplifier 41 in consideration of both the gain and intermodulation distortion in the low noise amplifier 41.

Similarly, in the conductive state between the common terminal 140 and the selection terminal 142, the impedance in the second frequency band group, viewed from the common terminal 140 to the low noise amplifier 42 side, preferably intersects with a line connecting the center of the gain circle, which indicates the impedance at which the gain in the low noise amplifier 42 is maximized in the second frequency band group, to the point at which the IIP3 of the low noise amplifier 42 is maximized in the second frequency band group on the Smith chart.

Accordingly, the output impedance matching is capable of being improved or optimized at the output side of the low noise amplifier 42 in consideration of both the gain and the intermodulation distortion in the low noise amplifier 42.

Figure 4:
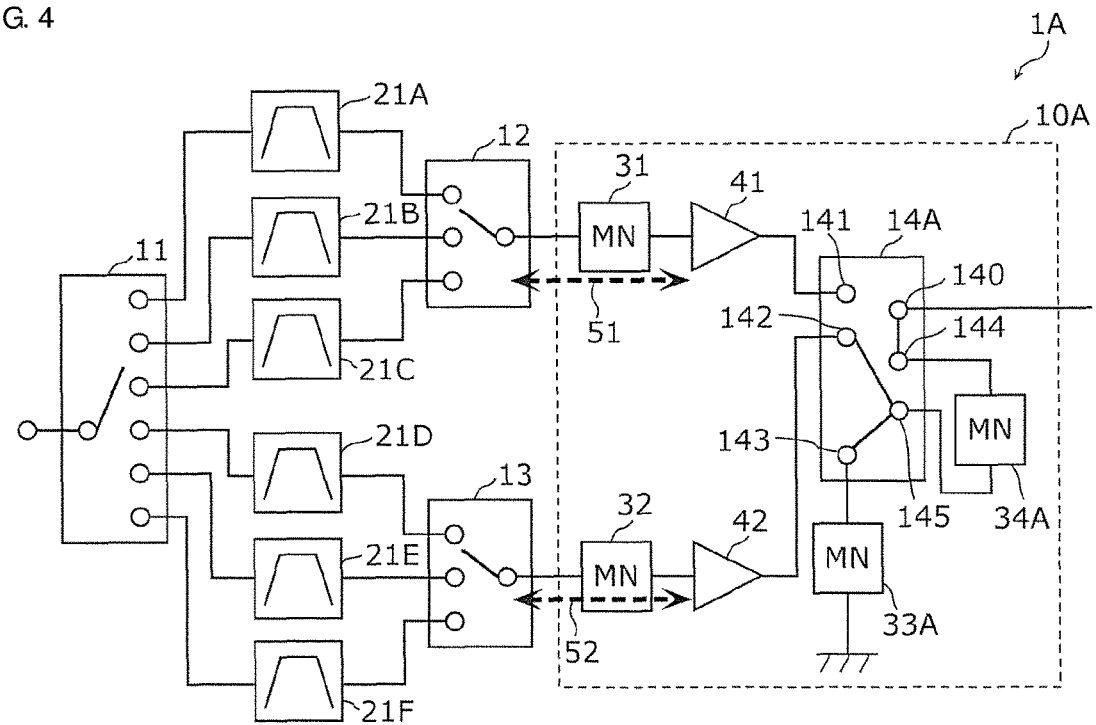
FIG. 4 is a diagram illustrating an exemplary circuit configuration of a front end module according to a first modification of a preferred embodiment of the present invention.

FIG. 4 is a diagram illustrating an exemplary circuit configuration of a front end module 1A according to a first modification of a preferred embodiment of the present invention. Referring to FIG. 4, the front end module 1A is a reception front end circuit and includes a high-frequency circuit 10A, the switches 11, 12, and 13, and the filters 21A, 21B, 21C, 21D, 21E, and 21F. The front end module 1A according to the present modification differs from the front end module 1 according to the above-described preferred embodiment in the configuration of a switch 14A and output-side impedance matching circuits connected to the switch 14A. A description of the same points in the front end module 1A according to the present modification as those in the front end module 1 according to the above-described preferred embodiment is omitted herein, and points different from those in the front end module 1 according to the above-described preferred embodiment will mainly be described.

The high-frequency circuit 10A includes the low noise amplifiers 41 and 42, the switch 14A, the input-side impedance matching circuits 31 and 32, output-side impedance matching circuits 33A and 34A, and the signal paths 51 and 52.

The switch 14A is the first switch that is disposed at the output side of the low noise amplifiers 41 and 42 and that includes the common terminal 140, the selection terminal 141 (the first selection terminal), the selection terminal 142 (the second selection terminal), the selection terminal 143 (the third selection terminal), a selection terminal 144 (a fifth selection terminal), and a selection terminal 145 (a sixth selection terminal). The selection terminal 141 is connected to the output terminal of the low noise amplifier 41, the selection terminal 142 is connected to the output terminal of the low noise amplifier 42, and the selection terminal 144 is connected to the common terminal 140. The switch 14A exclusively switches between the conductive state between the selection terminal 141 and the common terminal 140 and the conductive state between the selection terminal 142 and the common terminal 140. In addition, the switch 14A switches between the conductive state and the non-conductive state between the common terminal 140 and the selection terminal 143. More specifically, the switch 14A is preferably a multi-port switch, for example, capable of switching between connection modes. For example, the connection modes include (a) simultaneous performing of the connection between the common terminal 140 and the selection terminal 141 and the connection between the common terminal 140 and the selection terminal 143, (b) simultaneous performing of the connection between the common terminal 140 and the selection terminal 142 and the connection between the common terminal 140 and the selection terminal 143, (c) simultaneous performing of the connection between the selection terminal 145 and the selection terminal 141 and the connection between the common terminal 140 and the selection terminal 143, (d) simultaneous performing of the connection between the selection terminal 145 and the selection terminal 142 and the connection between the common terminal 140 and the selection terminal 143, (e) simultaneous performing of the connection between the common terminal 140 and the selection terminal 141 and the connection between the selection terminal 143 and the selection terminal 145, and (f) simultaneous performing of the connection between the common terminal 140 and the selection terminal 142 and the connection between the selection terminal 143 and the selection terminal 145.

The output-side impedance matching circuit 33A is the first parallel matching circuit connected between the selection terminal 143, among the plurality of selection terminals, and the ground. The output-side impedance matching circuit 33A is capable of changing the impedance at the output terminal 411 side of the low noise amplifier 41 or the impedance at the output terminal 421 side of the low noise amplifier 42 to predetermined impedance with the conductive state between the selection terminal 143 and the common terminal 140.

The output-side impedance matching circuit 34A is a first serial matching circuit connected between the selection terminal 144 and the selection terminal 145, among the plurality of selection terminals. The connection of the selection terminal 141 to the selection terminal 145 causes the output-side impedance matching circuit 34A to be provided in series between the selection terminal 141 and the common terminal 140, and the connection of the selection terminal 142 to the selection terminal 145 causes the output-side impedance matching circuit 34A to be provided in series between the selection terminal 142 and the common terminal 140.

For example, when the connection mode (a) is selected, a path connecting the low noise amplifier 41 to the common terminal 140 is provided and the output-side impedance matching circuit 33A is shunt-connected to the path. When the connection mode (b) is selected, a path connecting the low noise amplifier 42 to the common terminal 140 is provided and the output-side impedance matching circuit 33A is shunt-connected to the path. When the connection mode (c) is selected, a path connecting the low noise amplifier 41 to the common terminal 140 is provided, the output-side impedance matching circuit 34A is provided in series on the path, and the output-side impedance matching circuit 33A is shunt-connected to the path. When the connection mode (d) is selected, a path connecting the low noise amplifier 42 to the common terminal 140 is provided, the output-side impedance matching circuit 34A is provided in series on the path, and the output-side impedance matching circuit 33A is shunt-connected to the path. When the connection mode (e) is selected, a path connecting the low noise amplifier 41 to the common terminal 140 is provided and a circuit in which the output-side impedance matching circuit 33A is connected in series to the output-side impedance matching circuit 34A is shut-connected to the path. When the connection mode (f) is selected, a path connecting the low noise amplifier 42 to the common terminal 140 is provided and a circuit in which the output-side impedance matching circuit 33A is connected in series to the output-side impedance matching circuit 34A is shunt-connected to the path.

In other words, any of the connection between the selection terminal 141 and the common terminal 140 and the conductive state between the selection terminal 141 and the common terminal 140 via the selection terminal 145, the output-side impedance matching circuit 34A, and the selection terminal 144 and either of the connection between the selection terminal 142 and the common terminal 140 and the conductive state between the selection terminal 142 and the common terminal 140 via the selection terminal 145, the output-side impedance matching circuit 34A, and the selection terminal 144 are exclusively switched through the switching with the switch 14A.

Each of the output-side impedance matching circuits 33A and 34A has a circuit configuration in which circuit elements, such as an inductor and a capacitor, for example, are connected in series or in parallel to each other.

In the above-described configuration, the front end module 1A is in the state in which one of the filters 21A to 21C is connected to the antenna element 2 and the signal path 51 and the state in which the low noise amplifier 41 is connected to the RFIC 3, or in the state in which one of the filters 21D to 21F is connected to the antenna element 2 and the signal path 52 and the state in which the low noise amplifier 42 is connected to the RFIC 3 through the switching with the switches 11 to 14A.

With the above-described configuration, since the output-side impedance matching circuit 34A is connected to the selection terminals 144 and 145 of the switch 14A and the output-side impedance matching circuit 33A is connected to the selection terminal 143, the output-side impedance matching circuits 33A and 34A are capable of being selectively added to the path that is connected without adding an impedance matching circuit for each amplifier depending on whether the high-frequency circuit 10A is in the state in which the low noise amplifier 41 is connected to the common terminal 140 or the state in which the low noise amplifier 42 is connected to the common terminal 140.

Accordingly, one of the connection modes (a) to (f) is capable of being appropriately selected depending on the six signal transmission modes, such as the connection between the signal path 51 and either of the filters 21A to 21C and the connection between the signal path 52 and either of the filters 21D to 21F.

Consequently, the output impedance viewed from the common terminal 140 to the amplifier side is capable of being matched with predetermined impedance regardless of which low noise amplifier, among the low noise amplifiers 41 and 42, is connected to the common terminal 140 (which frequency band group is used) and regardless of which band is used. The impedance at the output side of the low noise amplifiers 41 and 42 is varied depending on the frequency band group or the band that is used. As a result, it is possible to achieve the impedance matching at the output side of the low noise amplifiers 41 and 42 over a wide band including the first frequency band group and the second frequency band group with high accuracy using the compact output-side impedance matching circuits 33A and 34A.

Although a configuration is provided in the present modification in which the two output-side impedance matching circuits 33A and 34A are connected to the switch 14A, a configuration may be provided in which only the output-side impedance matching circuit 34A is connected to the switch 14A.

Figure 5:
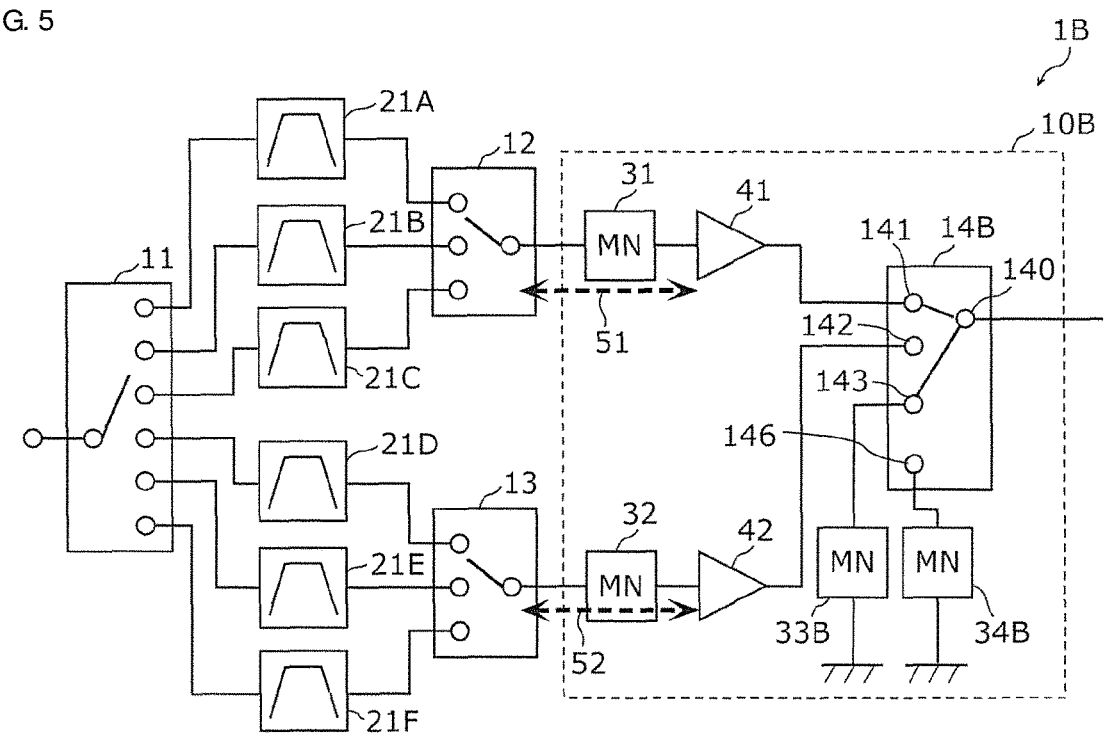
FIG. 5 is a diagram illustrating an exemplary circuit configuration of a front end module according to a second modification of a preferred embodiment of the present invention.

FIG. 5 is a diagram illustrating an exemplary circuit configuration of a front end module 1B according to a second modification of a preferred embodiment of the present invention. Referring to FIG. 5, the front end module 1B is a reception front end circuit including a high-frequency circuit 10B, the switches 11, 12, and 13, and the filters 21A, 21B, 21C, 21D, 21E, and 21F. The front end module 1B according to the present modification differs from the front end module 1 according to the above-described preferred embodiment in the configuration of a switch 14B and output-side impedance matching circuits connected to the switch 14B. A description of the same points in the front end module 1B according to the present modification as those in the front end module 1 according to the above-described preferred embodiment is omitted herein, and points different from those in the front end module 1 according to the above-described preferred embodiment will mainly be described.

The high-frequency circuit 10B includes the low noise amplifiers 41 and 42, the switch 14B, the input-side impedance matching circuits 31 and 32, output-side impedance matching circuits 33B and 34B, and the signal paths 51 and 52.

The switch 14B is the first switch that is disposed at the output side of the low noise amplifiers 41 and 42 and that includes the common terminal 140, the selection terminal 141 (the first selection terminal), the selection terminal 142 (the second selection terminal), the selection terminal 143 (the third selection terminal), and a selection terminal 146 (a fourth selection terminal). The switch 14B is preferably a multi-port switch, for example, capable of exclusively switching between the conductive state between the selection terminal 141 and the common terminal 140 and the conductive state between the selection terminal 142 and the common terminal 140, switching between the conductive state and the non-conductive state between the selection terminal 143 and the common terminal 140, and switching between the conductive state and the non-conductive state between the selection terminal 146 and the common terminal 140.

The output-side impedance matching circuit 33B is the first parallel matching circuit connected between the selection terminal 143, among the plurality of selection terminals, and the ground. The output-side impedance matching circuit 33B is capable of changing the impedance at the output terminal 411 side of the low noise amplifier 41 or the impedance at the output terminal 421 side of the low noise amplifier 42 to predetermined impedance with the conductive state between the selection terminal 143 and the common terminal 140.

The output-side impedance matching circuit 34B is a second parallel matching circuit connected between the selection terminal 146, among the plurality of selection terminals, and the ground. The output-side impedance matching circuit 34B is capable of changing the impedance at the output terminal 411 side of the low noise amplifier 41 or the impedance at the output terminal 421 side of the low noise amplifier 42 to predetermined impedance with the conductive state between the selection terminal 146 and the common terminal 140.

More specifically, for example, a connection mode may be provided, in which (a) the connection between the common terminal 140 and the selection terminal 141 and the connection between the common terminal 140 and the selection terminal 143 are simultaneously performed or (b) the connection between the common terminal 140 and the selection terminal 142 and the connection between the common terminal 140 and the selection terminal 146 are simultaneously performed.

When the connection mode (a) is selected, a path connecting the low noise amplifier 41 to the common terminal 140 is provided and the output-side impedance matching circuit 33B is shunt-connected to the path. When the connection mode (b) is selected, a path connecting the low noise amplifier 42 to the common terminal 140 is provided and the output-side impedance matching circuit 34B is shunt-connected to the path.

Each of the output-side impedance matching circuits 33B and 34B has a circuit configuration in which circuit elements, such as an inductor and a capacitor, for example, are connected in series or in parallel to each other.

In the above-described configuration, the front end module 1B is in the state in which one of the filters 21A to 21C is connected to the antenna element 2 and the signal path 51 and the state in which the low noise amplifier 41 is connected to the RFIC 3 or in the state in which one of the filters 21D to 21F is connected to the antenna element 2 and the signal path 52 and the state in which the low noise amplifier 42 is connected to the RFIC 3 through the switching with the switches 11 to 14B.

With the above configuration, in addition to the connection modes (a) and (b), either of (c) simultaneous performing of the connection between the common terminal 140 and the selection terminal 141 and the connection between the common terminal 140 and the selection terminal 146, (d) simultaneous performing of the connection between the common terminal 140 and the selection terminal 142 and the connection between the common terminal 140 and the selection terminal 143, (e) simultaneous performing of the connection between the common terminal 140 and the selection terminal 141, the non-connection between the common terminal 140 and the selection terminal 143, and the non-connection between the common terminal 140 and the selection terminal 146, (f) simultaneous performing of the connection between the common terminal 140 and the selection terminal 142, the non-connection between the common terminal 140 and the selection terminal 143, and the non-connection between the common terminal 140 and the selection terminal 146, (g) simultaneous performing of the connection between the common terminal 140 and the selection terminal 141, the connection between the common terminal 140 and the selection terminal 143, and the connection between the common terminal 140 and the selection terminal 146, and (h) simultaneous performing of the connection between the common terminal 140 and the selection terminal 142, the connection between the common terminal 140 and the selection terminal 143, and the connection between the common terminal 140 and the selection terminal 146, is capable of being appropriately selected depending on the six signal transmission modes including, for example, the connection between the signal path 51 and either of the filters 21A to 21C and the connection between the signal path 52 and either of the filters 21D to 21F.

Accordingly, the output impedance viewed from the common terminal 140 to the amplifier side is capable of being matched with predetermined impedance regardless of which low noise amplifier, among the low noise amplifiers 41 and 42, is connected to the common terminal 140 (which frequency band group is used) and regardless of which band is used. The output impedance at the output side of the low noise amplifiers 41 and 42 is varied depending on the frequency band group or the band that is used. Consequently, it is possible to achieve the impedance matching at the output side of the low noise amplifiers 41 and 42 over a wide band including the first frequency band group and the second frequency band group with high accuracy using the compact output-side impedance matching circuits 33B and 34B.

Although the configuration is provided in the present modification in which the two output-side impedance matching circuits 33B and 34B are connected to the switch 14B, a configuration may be provided in which three or more shunt-connection output-side impedance matching circuits are connected in association with three or more selection terminals. The impedance matching at the output side of the low noise amplifiers 41 and 42 is capable of being achieved with higher accuracy as the number of the shunt-connection output-side impedance matching circuits that are connected increases.

Figure 6:
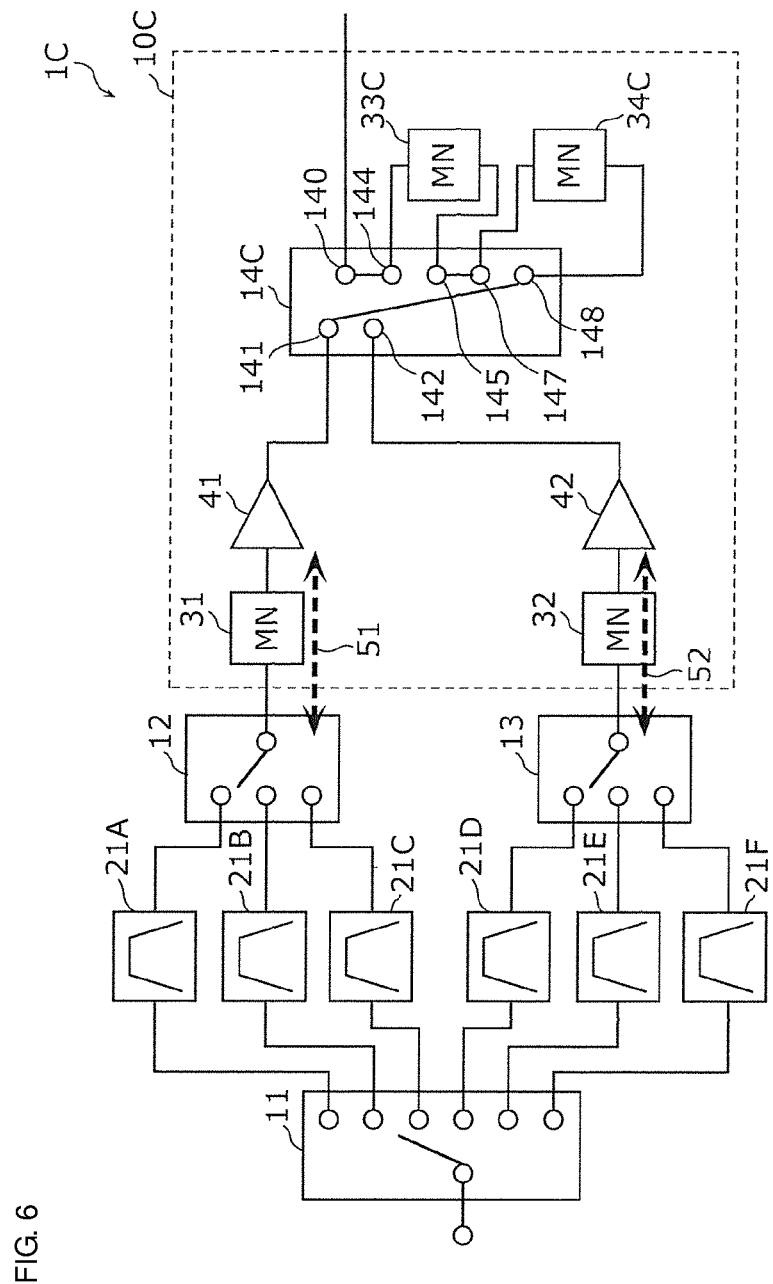
FIG. 6 is a diagram illustrating an exemplary circuit configuration of a front end module according to a third modification of a preferred embodiment of the present invention.

FIG. 6 is a diagram illustrating an exemplary circuit configuration of a front end module 1C according to a third modification of a preferred embodiment of the present invention. Referring to FIG. 6, the front end module 1C is a reception front end circuit including a high-frequency circuit 10C, the switches 11, 12, and 13, and the filters 21A, 21B, 21C, 21D, 21E, and 21F. The front end module 1C according to the present modification differs from the front end module 1 according to the above-described preferred embodiment in the configuration of a switch 14C and output-side impedance matching circuits connected to the switch 14C. A description of the same points in the front end module 1C according to the present modification as those in the front end module 1 according to the above-described preferred embodiment is omitted herein, and points different from those in the front end module 1 according to the above-described preferred embodiment will mainly be described.

The high-frequency circuit 10C includes the low noise amplifiers 41 and 42, the switch 14C, the input-side impedance matching circuits 31 and 32, output-side impedance matching circuits 33C and 34C, and the signal paths 51 and 52.

The switch 14C is the first switch that is disposed at the output side of the low noise amplifiers 41 and 42 and that includes the common terminal 140, the selection terminal 141 (the first selection terminal), the selection terminal 142 (the second selection terminal), the selection terminal 144 (the fifth selection terminal), the selection terminal 145 (the sixth selection terminal), a selection terminal 147 (a seventh selection terminal), and a selection terminal 148 (an eighth selection terminal). The selection terminal 141 is connected to the output terminal of the low noise amplifier 41, and the selection terminal 142 is connected to the output terminal of the low noise amplifier 42. The selection terminal 144 is connected to the common terminal 140, and the selection terminal 145 is connected to the selection terminal 147.

The switch 14C is preferably a multi-port switch, for example, capable of exclusively switching between any of (1) the connection between the selection terminal 141 and the common terminal 140, (2) the conductive state between the selection terminal 141 and the common terminal 140 via the selection terminal 145, the output-side impedance matching circuit 33C, and the selection terminal 144, and (3) the conductive state between the selection terminal 141 and the common terminal 140 via the selection terminal 148, the output-side impedance matching circuit 34C, and the selection terminal 147, and any of (4) the connection between the selection terminal 142 and the common terminal 140, (5) the conductive state between the selection terminal 142 and the common terminal 140 via the selection terminal 145, the output-side impedance matching circuit 33C, and the selection terminal 144, and (6) the conductive state between the selection terminal 142 and the common terminal 140 via the selection terminal 148, the output-side impedance matching circuit 34C, and the selection terminal 147.

The output-side impedance matching circuit 33C is the first serial matching circuit connected between the selection terminal 144 and the selection terminal 145, among the plurality of selection terminals. The connection of the selection terminal 141 to the selection terminal 145 causes the output-side impedance matching circuit 33C to be provided in series between the selection terminal 141 and the common terminal 140, and the connection of the selection terminal 142 to the selection terminal 145 causes the output-side impedance matching circuit 33C to be provided in series between the selection terminal 142 and the common terminal 140.

The output-side impedance matching circuit 34C is a second serial matching circuit connected between the selection terminal 147 and the selection terminal 148, among the plurality of selection terminals. The connection of the selection terminal 141 to the selection terminal 148 causes the output-side impedance matching circuits 33C and 34C to be provided in series between the selection terminal 141 and the common terminal 140, and the connection of the selection terminal 142 to the selection terminal 148 causes the output-side impedance matching circuits 33C and 34C to be provided in series between the selection terminal 142 and the common terminal 140.

More specifically, when the connection mode (1) is selected, a path connecting the low noise amplifier 41 to the common terminal 140 is provided and no output-side impedance matching circuit is connected to the path. When the connection mode (2) is selected, a path connecting the low noise amplifier 41 to the common terminal 140 is provided and the output-side impedance matching circuit 33C is provided in series on the path. When the connection mode (3) is selected, a path connecting the low noise amplifier 41 to the common terminal 140 is provided and the output-side impedance matching circuits 33C and 34C are provided in series on the path. When the connection mode (4) is selected, a path connecting the low noise amplifier 42 to the common terminal 140 is provided and no output-side impedance matching circuit is connected on the path. When the connection mode (5) is selected, a path connecting the low noise amplifier 42 to the common terminal 140 is provided and the output-side impedance matching circuit 33C is provided in series on the path. When the connection mode (6) is selected, a path connecting the low noise amplifier 42 to the common terminal 140 is provided and the output-side impedance matching circuits 33C and 34C are provided in series on the path.

Each of the output-side impedance matching circuits 33C and 34C has a circuit configuration in which circuit elements, such as an inductor and a capacitor, for example, are connected in series or in parallel to each other.

In the above configuration, the front end module 1C is in a state in which one of the filters 21A to 21C is connected to the antenna element 2 and the signal path 51 and a state in which the low noise amplifier 41 is connected to the RFIC 3 or in a state in which one of the filters 21D to 21F is connected to the antenna element 2 and the signal path 52 and a state in which the low noise amplifier 42 is connected to the RFIC 3 through the switching with the switches 11 to 14C.

With the above configuration, any of the connection modes (1) to (6) is capable of being appropriately selected depending on the six signal transmission modes, such as the connection between the signal path 51 and either of the filters 21A to 21C and the connection between the signal path 52 and either of the filters 21D to 21F.

Accordingly, the output impedance viewed from the common terminal 140 to the amplifier side is capable of being matched with predetermined impedance regardless of which low noise amplifier, among the low noise amplifiers 41 and 42, is connected to the common terminal 140 (which frequency band group is used) and regardless of which band is used. The output impedance at the output side of the low noise amplifiers 41 and 42 is varied depending on the frequency band group or the band that is used. Consequently, it is possible to achieve the impedance matching at the output side of the low noise amplifiers 41 and 42 over a wide band including the first frequency band group and the second frequency band group with high accuracy using the compact output-side impedance matching circuits 33C and 34C.

Although the configuration is provided in the present modification in which the two output-side impedance matching circuits 33C and 34C are connected to the switch 14C, a configuration may be provided in which three or more series connection output-side impedance matching circuits are connected to each other. The impedance matching at the output side of the low noise amplifiers 41 and 42 is capable of being achieved with higher accuracy as the number of the series connection output-side impedance matching circuits that are connected increases.

Figure 7A:
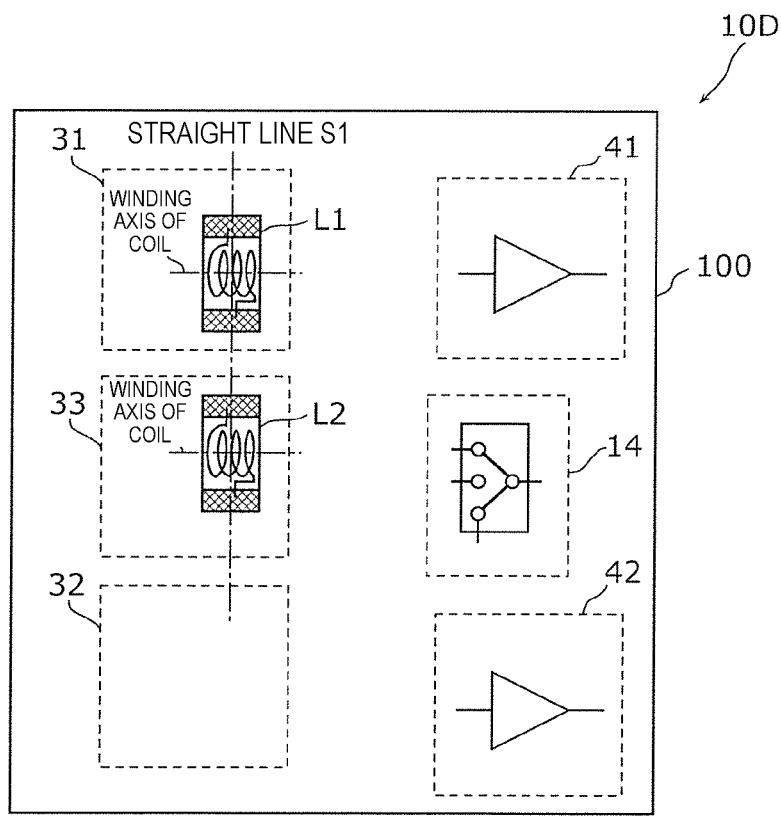
FIG. 7A is a diagram illustrating an exemplary mounting configuration of a high-frequency circuit according to a fourth modification of a preferred embodiment of the present invention.

FIG. 7A is a diagram illustrating an exemplary mounting configuration of a high-frequency circuit 10D according to a fourth modification of a preferred embodiment of the present invention. The arrangement layout of circuit elements defining the high-frequency circuit 10D according to the present modification is illustrated in FIG. 7A.

The high-frequency circuit 10D includes the low noise amplifiers 41 and 42, the switch 14, the input-side impedance matching circuits 31 and 32, and the output-side impedance matching circuit 33. The circuit connection configuration of the high-frequency circuit 10D according to the present modification is the same as that of the high-frequency circuit 10 according to the above-described preferred embodiment.

The low noise amplifiers 41 and 42, the switch 14, the input-side impedance matching circuits 31 and 32, and the output-side impedance matching circuit 33 are provided on a mounting substrate 100. These circuit elements are not necessarily mounted on the surface of the mounting substrate 100 and may be provided in the mounting substrate 100.

The input-side impedance matching circuit 31 includes an inductor L1 (a first inductor) mounted on the mounting substrate 100.

The output-side impedance matching circuit 33 includes an inductor L2 (a second inductor) mounted on the mounting substrate 100.

The winding axis of the coil defining the inductor L1 is perpendicular or substantially perpendicular to the longitudinal direction of the inductor L1, and the winding axis of the coil defining the inductor L2 is perpendicular or substantially perpendicular to the longitudinal direction of the inductor L2. In a planar view of the mounting substrate 100, the longitudinal direction of the inductor L1 coincides or substantially coincides with the longitudinal direction of the inductor L2, and the inductor L1 and the inductor L2 are disposed on the same straight line S1.

Accordingly, since the distance between magnetic fluxes occurring around the inductors L1 and L2 is ensured, the interaction of the magnetic fields is reduced or prevented. Consequently, the isolation between the input-side impedance matching circuit 31 and the output-side impedance matching circuit 33 is improved.

With the above-described configuration, it is possible to achieve the impedance matching at the output side of the low noise amplifiers 41 and 42 with high accuracy using the compact output-side impedance matching circuit 33.

When the input-side impedance matching circuit 32 includes an inductor L7 mounted on the mounting substrate 100, the winding axis of the coil defining the inductor L7 may be perpendicular or substantially perpendicular to the longitudinal direction of the inductor L7. In a planar view of the mounting substrate 100, the longitudinal direction of the inductor L7 may coincide or substantially coincide with the longitudinal direction of the inductor L2, and the inductor L7 and the inductor L2 may be disposed on the same straight line S1.

Figure 7B:
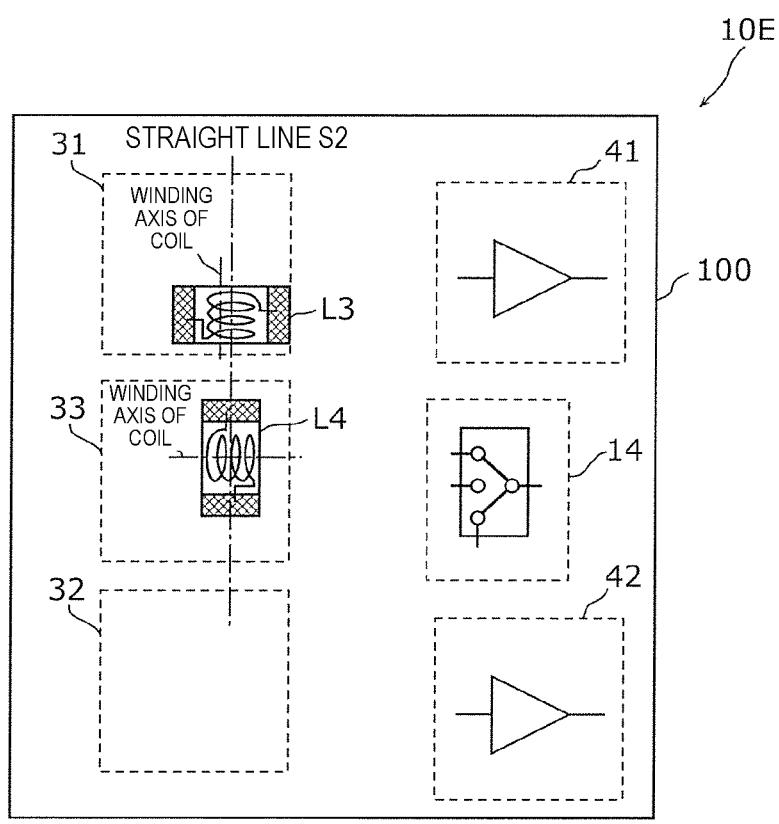
FIG. 7B is a diagram illustrating an exemplary mounting configuration of a high-frequency circuit according to a fifth modification of a preferred embodiment of the present invention.

FIG. 7B is a diagram illustrating an exemplary mounting configuration of a high-frequency circuit 10E according to a fifth modification of a preferred embodiment of the present invention. The arrangement layout of circuit elements defining the high-frequency circuit 10E according to the present modification is illustrated in FIG. 7B.

The high-frequency circuit 10E includes the low noise amplifiers 41 and 42, the switch 14, the input-side impedance matching circuits 31 and 32, and the output-side impedance matching circuit 33. The circuit connection configuration of the high-frequency circuit 10E according to the present modification is the same or substantially the same as that of the high-frequency circuit 10 according to the above-described preferred embodiment.

The low noise amplifiers 41 and 42, the switch 14, the input-side impedance matching circuits 31 and 32, and the output-side impedance matching circuit 33 are provided on the mounting substrate 100. These circuit elements are not necessarily mounted on the surface of the mounting substrate 100 and may be provided in the mounting substrate 100.

The input-side impedance matching circuit 31 includes an inductor L3 (the first inductor) mounted on the mounting substrate 100.

The output-side impedance matching circuit 33 includes an inductor L4 (the second inductor) mounted on the mounting substrate 100.

The winding axis of the coil defining the inductor L3 is perpendicular or substantially perpendicular to the longitudinal direction of the inductor L3, and the winding axis of the coil defining the inductor L4 is perpendicular or substantially perpendicular to the longitudinal direction of the inductor L4. In a planar view of the mounting substrate 100, the longitudinal direction of the inductor L3 is orthogonal or substantially orthogonal to the longitudinal direction of the inductor L4. The inductor L3 and the inductor L4 are arranged so that a straight line S2 that passes through the center of the inductor L4 and that is parallel or substantially parallel to the longitudinal direction of the inductor L4 passes through the center of the inductor L3.

Accordingly, since the magnetic fluxes occurring around the inductors L3 and L4 are orthogonal or substantially orthogonal to each other, the interaction of the magnetic fields is reduced or prevented. Consequently, the isolation between the input-side impedance matching circuit 31 and the output-side impedance matching circuit 33 is improved.

With the above-described configuration, it is possible to achieve the impedance matching at the output side of the low noise amplifiers 41 and 42 with high accuracy using the compact output-side impedance matching circuit 33.

The positional relationship between the inductors L3 and L4 may be opposite to the above-described positional relationship. Specifically, in a planar view of the mounting substrate 100, the longitudinal direction of the inductor L4 may be orthogonal or substantially orthogonal to the longitudinal direction of the inductor L3, and the inductor L3 and the inductor L4 may be disposed so that a straight line that passes through the center of the inductor L3 and that is parallel or substantially parallel to the longitudinal direction of the inductor L3 passes through the center of the inductor L4.

When the input-side impedance matching circuit 32 includes an inductor L8 mounted on the mounting substrate 100, the winding axis of the coil defining the inductor L8 may be perpendicular or substantially perpendicular to the longitudinal direction of the inductor L8. In a planar view of the mounting substrate 100, the longitudinal direction of the inductor L8 may be orthogonal or substantially orthogonal to the longitudinal direction of the inductor L4, and the inductor L8 and the inductor L4 may be disposed so that a straight line that passes through the center of the inductor L4 and that is parallel or substantially parallel to the longitudinal direction of the inductor L4 passes through the center of the inductor L8.

Figure 7C:
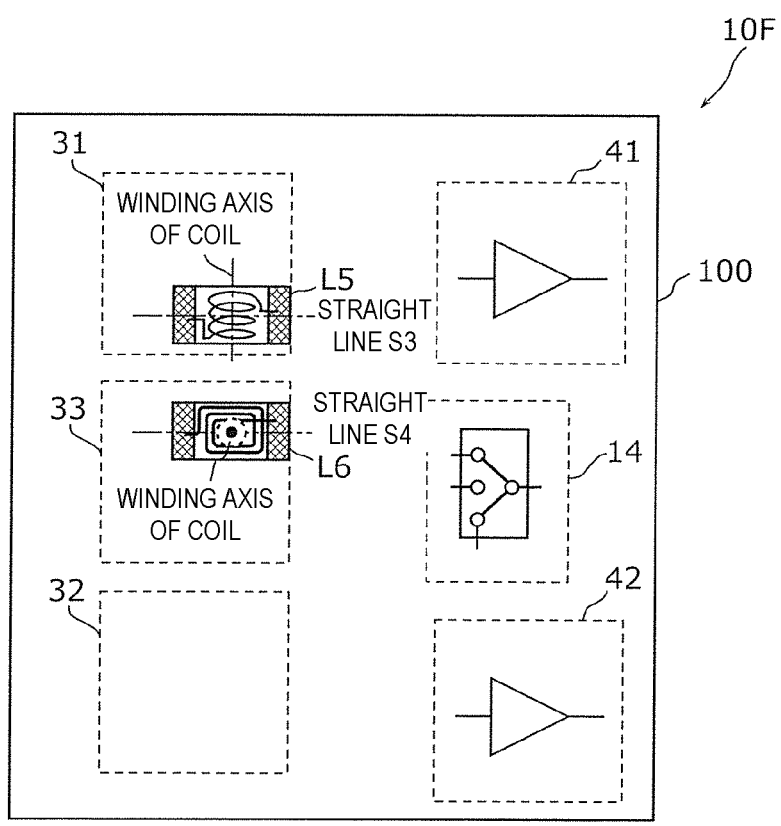
FIG. 7C is a diagram illustrating an exemplary mounting configuration of a high-frequency circuit according to a sixth modification of a preferred embodiment of the present invention.

FIG. 7C is a diagram illustrating an exemplary mounting configuration of a high-frequency circuit 10F according to a sixth modification of a preferred embodiment of the present invention. The arrangement layout of circuit elements defining the high-frequency circuit 10F according to the present modification is illustrated in FIG. 7C.

The high-frequency circuit 10F includes the low noise amplifiers 41 and 42, the switch 14, the input-side impedance matching circuits 31 and 32, and the output-side impedance matching circuit 33. The circuit connection configuration of the high-frequency circuit 10F according to the present modification is the same as that of the high-frequency circuit 10 according to the preferred embodiment.

The low noise amplifiers 41 and 42, the switch 14, the input-side impedance matching circuits 31 and 32, and the output-side impedance matching circuit 33 are provided on the mounting substrate 100. These circuit elements are not necessarily mounted on the surface of the mounting substrate 100 and may be provided in the mounting substrate 100.

The input-side impedance matching circuit 31 includes an inductor L5 (the first inductor) mounted on the mounting substrate 100.

The output-side impedance matching circuit 33 includes an inductor L6 (the second inductor) mounted on the mounting substrate 100.

The winding axis of the coil defining the inductor L5 is perpendicular or substantially perpendicular to the longitudinal direction of the inductor L5, and the winding axis of the coil composing the inductor L6 is perpendicular or substantially perpendicular to the longitudinal direction of the inductor L6.

The winding axis of the coil of the inductor L5 is parallel or substantially parallel to the main surface of the mounting substrate 100, and the winding axis of the coil of the inductor L6 is perpendicular or substantially perpendicular to the main surface of the mounting substrate 100. In a planar view of the mounting substrate 100, the inductor L5 and the inductor L6 are parallel or substantially parallel to each other so that the longitudinal direction of the inductor L5 coincides or substantially coincides with the longitudinal direction of the inductor L6.

Accordingly, since the magnetic fluxes occurring around the inductors L5 and L6 are orthogonal or substantially orthogonal to each other, the interaction of the magnetic fields is reduced or prevented. Consequently, the isolation between the input-side impedance matching circuit 31 and the output-side impedance matching circuit 33 is improved.

With the above-described configuration, it is possible to achieve the impedance matching at the output side of the low noise amplifiers 41 and 42 with high accuracy using the compact output-side impedance matching circuit 33.

In the present modification, the inductor L5 may preferably be a surface mounted device (SMD) component having a high Q value, as compared to the inductor L6. In this case, the transmission loss upstream of the low noise amplifier 41 is reduced.

The positional relationship between the inductors L5 and L6 may be opposite to the above-described positional relationship. Specifically, the winding axis of the coil of the inductor L6 may be parallel or substantially parallel to the main surface of the mounting substrate 100 and the winding axis of the coil of the inductor L5 may be perpendicular or substantially perpendicular to the main surface of the mounting substrate 100. In a planar view of the mounting substrate 100, the inductor L5 and the inductor L6 may be disposed in parallel or substantially in parallel to each other so that the longitudinal direction of the inductor L5 coincides or substantially coincides with the longitudinal direction of the inductor L6.

When the input-side impedance matching circuit 32 includes an inductor L9 mounted on the mounting substrate 100, the winding axis of the coil of the inductor L9 may be parallel or substantially parallel to the main surface of the mounting substrate 100 and the winding axis of the coil of the inductor L6 may be perpendicular or substantially perpendicular to the main surface of the mounting substrate 100. In a planar view of the mounting substrate 100, the inductor L9 and the inductor L6 may be disposed in parallel or substantially in parallel to each other so that the longitudinal direction of the inductor L9 coincides or substantially coincides with the longitudinal direction of the inductor L6.

Although the high-frequency circuits, the front end modules, and the communication apparatuses according to preferred embodiments and modifications of the present invention are described above, the present invention is not limited to the above-described preferred embodiments and modifications. Other preferred embodiments achieved by combining arbitrary components in the preferred embodiments and modifications, modifications made by making various changes contemplated by the persons skilled in the art to the preferred embodiments within the scope and sprit of the present invention, and various devices incorporating the high-frequency circuits, the front end modules, and the communication apparatuses according to preferred embodiments and modifications of the present invention are also included in the present invention.

For example, although the high-frequency circuits each include the input-side impedance matching circuits 31 and 32, the high-frequency circuits may not include the input-side impedance matching circuits 31 and 32.

Preferred embodiments of the present invention are widely used in communication devices, such as cellular phones, as high-frequency circuits, front end modules, and communication apparatuses, which are compact, which are applicable to a multiband system, and which are capable of achieving the output impedance matching.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency circuit comprising:
   a first signal path on which a high-frequency signal in a first frequency band group is transmitted;
   a second signal path on which a high-frequency signal in a second frequency band group is transmitted;
   a first switch that includes a common terminal and a plurality of selection terminals;
   a first amplifier that includes a first input terminal and a first output terminal, the first input terminal being connected to the first signal path, and the first output terminal being connected to a first selection terminal, among the plurality of selection terminals;
   a second amplifier that includes a second input terminal and a second output terminal, the second input terminal being connected to the second signal path, and the second output terminal being connected to a second selection terminal, among the plurality of selection terminals; and
   an output-side impedance matching circuit that is connected to at least one selection terminal, which is different from the first selection terminal and the second selection terminal, among the plurality of selection terminals, and that matches impedance of the first amplifier at the first output terminal side or impedance of the second amplifier at the second output terminal side with a predetermined impedance with a conductive state between the at least one selection terminal and the common terminal; wherein
   a conductive state between the first selection terminal and the common terminal and a conductive state between the second selection terminal and the common terminal are exclusively switched with the first switch.

2. The high-frequency circuit according to claim 1, wherein, on a Smith chart, impedance in the first frequency band group, viewed from the common terminal to a side of the first amplifier, intersects with a line connecting a center of a gain circle, which indicates the impedance at which gain in the first amplifier is maximized in the first frequency band group, to a point at which a third order input intercept point of the first amplifier is maximized in the first frequency band group.

3. The high-frequency circuit according to claim 1, wherein, on a Smith chart, impedance in the second frequency band group, viewed from the common terminal to a side of the second amplifier side, intersects with a line connecting a center of a gain circle, which indicates the impedance at which gain in the second amplifier is maximized in the second frequency band group, to a point at which a third order input intercept point of the second amplifier is maximized in the second frequency band group.

4. The high-frequency circuit according to claim 1, wherein
the output-side impedance matching circuit includes a first parallel matching circuit connected between a third selection terminal, among the plurality of selection terminals, and ground; and
a conductive state between the first selection terminal and the common terminal and a conductive state between the second selection terminal and the common terminal is exclusively switched, and a conductive state and a non-conductive state between the third selection terminal and the common terminal is switched with the first switch.

5. The high-frequency circuit according to claim 4, wherein
the output-side impedance matching circuit further includes a second parallel matching circuit connected between a fourth selection terminal, among the plurality of selection terminals, and the ground; and
the conductive state between the first selection terminal and the common terminal and the conductive state between the second selection terminal and the common terminal is exclusively switched, the conductive state and the non-conductive state between the third selection terminal and the common terminal is switched, and a conductive state and a non-conductive state between the fourth selection terminal and the common terminal is switched with the first switch.

6. The high-frequency circuit according to claim 1, wherein
the output-side impedance matching circuit includes a first serial matching circuit connected between a fifth selection terminal and a sixth selection terminal, among the plurality of selection terminals;
the fifth selection terminal is connected to the common terminal; and
either of a connection between the first selection terminal and the common terminal and a conductive state between the first selection terminal and the common terminal via the sixth selection terminal, the first serial matching circuit, and the fifth selection terminal, and either of a connection between the second selection terminal and the common terminal and a conductive state between the second selection terminal and the common terminal via the sixth selection terminal, the first serial matching circuit, and the fifth selection terminal are exclusively switched with the first switch.

7. The high-frequency circuit according to claim 6, wherein
the output-side impedance matching circuit further includes a second serial matching circuit connected between a seventh selection terminal and an eighth selection terminal, among the plurality of selection terminals;

the sixth selection terminal is connected to the seventh selection terminal; and
any of the connection between the first selection terminal and the common terminal, the conductive state between the first selection terminal and the common terminal via the sixth selection terminal, the first serial matching circuit, and the fifth selection terminal, and a conductive state between the first selection terminal and the common terminal via the eighth selection terminal, the second serial matching circuit, and the seventh selection terminal, and any of the connection between the second selection terminal and the common terminal, the conductive state between the second selection terminal and the common terminal via the sixth selection terminal, the first serial matching circuit, and the fifth selection terminal, and a conductive state between the second selection terminal and the common terminal via the eighth selection terminal, the second serial matching circuit, and the seventh selection terminal, are exclusively switched with the first switch.

8. The high-frequency circuit according to claim 1, further comprising:
an input-side impedance matching circuit connected to the first input terminal or the second input terminal; and
a substrate on which the first switch, the first amplifier, the second amplifier, the input-side impedance matching circuit, and the output-side impedance matching circuit are mounted; wherein
the input-side impedance matching circuit includes a first inductor mounted on the substrate;
the output-side impedance matching circuit includes a second inductor mounted on the substrate;
a winding axis of a coil defining the first inductor is perpendicular or substantially perpendicular to a longitudinal direction of the first inductor;
a winding axis of a coil defining the second inductor is perpendicular or substantially perpendicular to a longitudinal direction of the second inductor; and
in a planar view of the substrate, the longitudinal direction of the first inductor coincides or substantially coincides with the longitudinal direction of the second inductor, and the first inductor and the second inductor are disposed on a common straight line.

9. The high-frequency circuit according to claim 1, further comprising:
an input-side impedance matching circuit connected to the first input terminal or the second input terminal; and
a substrate on which the first switch, the first amplifier, the second amplifier, the input-side impedance matching circuit, and the output-side impedance matching circuit are mounted; wherein
the input-side impedance matching circuit includes a first inductor mounted on the substrate;
the output-side impedance matching circuit includes a second inductor mounted on the substrate;
a winding axis of a coil defining the first inductor is perpendicular or substantially perpendicular to a longitudinal direction of the first inductor;
a winding axis of a coil defining the second inductor is perpendicular or substantially perpendicular to a longitudinal direction of the second inductor; and
in a planar view of the substrate, the longitudinal direction of the first inductor is orthogonal or substantially orthogonal to the longitudinal direction of the second inductor, and the first inductor and the second inductor are disposed so that a straight line that passes through a center of one of the first inductor and the second inductor and that is parallel or substantially parallel to the longitudinal direction of the one of the first inductor and the second inductor passes through a center of the other of the first inductor and the second inductor.

10. The high-frequency circuit according to claim 1, further comprising:
an input-side impedance matching circuit connected to the first input terminal or the second input terminal; and
a substrate on which the first switch, the first amplifier, the second amplifier, the input-side impedance matching circuit, and the output-side impedance matching circuit are mounted; wherein
the input-side impedance matching circuit includes a first inductor mounted on the substrate;
the output-side impedance matching circuit includes a second inductor mounted on the substrate;
a winding axis of a coil defining the first inductor is perpendicular or substantially perpendicular to a longitudinal direction of the first inductor;
a winding axis of a coil defining the second inductor is perpendicular or substantially perpendicular to a longitudinal direction of the second inductor;
a winding axis of a coil of one of the first inductor and the second inductor is parallel or substantially parallel to a main surface of the substrate;
a winding axis of a coil of the other of the first inductor and the second inductor is perpendicular or substantially perpendicular to the main surface of the substrate; and
in a planar view of the substrate, the first inductor and the second inductor are disposed in parallel or substantially in parallel to each other so that the longitudinal direction of the first inductor coincides or substantially coincides with the longitudinal direction of the second inductor.

11. A front end module comprising:
the high-frequency circuit according to claim 1;
a second switch including an antenna common terminal and a plurality of selection terminals;
a first filter that is disposed at an input side of the first amplifier, that is connected between the first signal path and the second switch, and a pass band of which is a first frequency band included in the first frequency band group; and
a second filter that is disposed at an input side of the second amplifier, that is connected between the second signal path and the second switch, and a pass band of which is a second frequency band included in the second frequency band group; wherein
connection and non-connection between the antenna common terminal and the first filter is switched and connection and non-connection between the antenna common terminal and the second filter is switched with the second switch.

12. The front end module according to claim 11, wherein, on a Smith chart, impedance in the first frequency band group, viewed from the common terminal to the first amplifier side, intersects with a line connecting a center of a gain circle, which indicates the impedance at which gain in the first amplifier is maximized in the first frequency band group, to a point at which a third order input intercept point of the first amplifier is maximized in the first frequency band group.

13. The front end module according to claim 11, wherein, on a Smith chart, impedance in the second frequency band group, viewed from the common terminal to the second amplifier side, intersects with a line connecting a center of a gain circle, which indicates the impedance at which gain in the second amplifier is maximized in the second frequency band group, to a point at which a third order input intercept point of the second amplifier is maximized in the second frequency band group.

14. The front end module according to claim 11, wherein the output-side impedance matching circuit includes a first parallel matching circuit connected between a third selection terminal, among the plurality of selection terminals, and ground; and
a conductive state between the first selection terminal and the common terminal and a conductive state between the second selection terminal and the common terminal is exclusively switched, and a conductive state and a non-conductive state between the third selection terminal and the common terminal is switched with the first switch.

15. The front end module according to claim 14, wherein the output-side impedance matching circuit further includes a second parallel matching circuit connected between a fourth selection terminal, among the plurality of selection terminals, and the ground; and
the conductive state between the first selection terminal and the common terminal and the conductive state between the second selection terminal and the common terminal is exclusively switched, the conductive state and the non-conductive state between the third selection terminal and the common terminal is switched, and a conductive state and a non-conductive state between the fourth selection terminal and the common terminal is switched with the first switch.

16. The front end module according to claim 11, wherein the output-side impedance matching circuit includes a first serial matching circuit connected between a fifth selection terminal and a sixth selection terminal, among the plurality of selection terminals;
the fifth selection terminal is connected to the common terminal; and
either of a connection between the first selection terminal and the common terminal and a conductive state between the first selection terminal and the common terminal via the sixth selection terminal, the first serial matching circuit, and the fifth selection terminal, and either of a connection between the second selection terminal and the common terminal and a conductive state between the second selection terminal and the common terminal via the sixth selection terminal, the first serial matching circuit, and the fifth selection terminal, are exclusively switched with the first switch.

17. The front end module according to claim 16, wherein the output-side impedance matching circuit further includes a second serial matching circuit connected between a seventh selection terminal and an eighth selection terminal, among the plurality of selection terminals;
the sixth selection terminal is connected to the seventh selection terminal; and
any of the connection between the first selection terminal and the common terminal, the conductive state between the first selection terminal and the common terminal via the sixth selection terminal, the first serial matching circuit, and the fifth selection terminal, and a conductive state between the first selection terminal and the common terminal via the eighth selection terminal, the second serial matching circuit, and the seventh selection terminal, and any of the connection between the second selection terminal and the common terminal, the conductive state between the second selection terminal and the common terminal via the sixth selection terminal, the first serial matching circuit, and the fifth selection terminal, and a conductive state between the second selection terminal and the common terminal via the eighth selection terminal, the second serial matching circuit, and the seventh selection terminal, are exclusively switched with the first switch.

18. The front end module according to claim 11, further comprising:
an input-side impedance matching circuit connected to the first input terminal or the second input terminal; and
a substrate on which the first switch, the first amplifier, the second amplifier, the input-side impedance matching circuit, and the output-side impedance matching circuit are mounted; wherein
the input-side impedance matching circuit includes a first inductor mounted on the substrate;
the output-side impedance matching circuit includes a second inductor mounted on the substrate;
a winding axis of a coil defining the first inductor is perpendicular or substantially perpendicular to a longitudinal direction of the first inductor;
a winding axis of a coil defining the second inductor is perpendicular or substantially perpendicular to a longitudinal direction of the second inductor; and
in a planar view of the substrate, the longitudinal direction of the first inductor coincides or substantially coincides with the longitudinal direction of the second inductor, and the first inductor and the second inductor are disposed on a common straight line.

19. The front end module according to claim 11, further comprising:
an input-side impedance matching circuit connected to the first input terminal or the second input terminal; and
a substrate on which the first switch, the first amplifier, the second amplifier, the input-side impedance matching circuit, and the output-side impedance matching circuit are mounted; wherein
the input-side impedance matching circuit includes a first inductor mounted on the substrate;
the output-side impedance matching circuit includes a second inductor mounted on the substrate;
a winding axis of a coil defining the first inductor is perpendicular or substantially perpendicular to a longitudinal direction of the first inductor;
a winding axis of a coil defining the second inductor is perpendicular or substantially perpendicular to a longitudinal direction of the second inductor; and
in a planar view of the substrate, the longitudinal direction of the first inductor is orthogonal or substantially orthogonal to the longitudinal direction of the second inductor, and the first inductor and the second inductor are disposed so that a straight line that passes through a center of one of the first inductor and the second inductor and that is parallel or substantially parallel to the longitudinal direction of the one of the first inductor and the second inductor passes through a center of the other of the first inductor and the second inductor.

20. A communication apparatus comprising:
a radio-frequency signal processing circuit that processes a high-frequency signal received with an antenna element; and
the front end module according to claim 11, which transmits the high-frequency signal between the antenna element and the radio-frequency signal processing circuit.

* * * * *